United States Patent [19]

Woolf et al.

[11] Patent Number: 4,773,945
[45] Date of Patent: Sep. 27, 1988

[54] SOLAR CELL WITH LOW INFRA-RED ABSORPTION AND METHOD OF MANUFACTURE

[75] Inventors: Lawrence D. Woolf, Carlsbad; John C. Bass, La Jolla, both of Calif.

[73] Assignee: GA Technologies, Inc., San Diego, Calif.

[21] Appl. No.: 97,497

[22] Filed: Sep. 14, 1987

[51] Int. Cl.$^4$ ............... H01L 31/06; H01L 31/18
[52] U.S. Cl. ..................... 136/256; 136/259; 136/262; 437/5; 357/30
[58] Field of Search ......... 136/256, 259, 262, 258 PC; 437/5; 357/30

[56] References Cited

U.S. PATENT DOCUMENTS

| | | | |
|---|---|---|---|
| 4,062,698 | 12/1977 | Blakeslee et al. | 136/246 |
| 4,128,680 | 12/1978 | Heaps et al. | 428/137 |
| 4,383,130 | 5/1983 | Uroshevich | 136/261 |

FOREIGN PATENT DOCUMENTS 2939348 4/1980 Fed. Rep. of Germany ...... 136/258 PC

OTHER PUBLICATIONS

K. -D. Rasch et al., "Compatibility of BSR and BSF Solar Cell Technology," *Proc. 14th IEEE Photovoltaic Specialists Conference,* 1980, pp. 141-145.
R. W. McClelland et al., "A Technique for Producing Epitaxial Films on Reuseable Substrates," *App. Phys. Lett.,* vol. 37, No. 6, Sep. 1980, pp. 560-562.
J. C. C. Fan et al. "Thin-Film GaAs Solar Cells," *Proc. 15th IEEE Photovoltaic Specialists Conference,* 1981, pp. 666-672.
C. I. H. Ashby and R. M. Biefeld, "Composition-Selective Photochemical Etching of Compound Semiconductors," *Appl. Phys. Lett.,* vol. 47, No. 1, Jul. 1985, pp. 62-63.
14th IEEE Photovoltaic Specialist Conference, Jan. 7, 1980, "Back Surface Reflectors for Solar Cells," by An-Ti Chai, pp. 156-160.
16th IEEE Photovoltaic Specialist Conference, Sep. 27, 1982, "Ultrathin GaAs and AlGaAs Solar Cell," by R. J. Boettcher et al., pp. 1470-1473.
18th IECEC, Aug. 21-16, 1983, "Multibandgap Photovoltaic Receiver Using Back Surface Reflectors," by Theodore G. Stern.
*Solar Cells,* vol. 19, pp. 19-38 (1986-87) "Optimum Efficiency of Single and Multiple Bandgap Cells in Thermophotovoltaic Energy Conversion," Dec. 23, 1985 by L. D. Woolf.

*Primary Examiner*—Aaron Weisstuch
*Attorney, Agent, or Firm*—Workman, Nydegger & Jensen

[57] ABSTRACT

A cell for using solar radiation to generate electrical power comprises a direct band gap (or high absorption coefficient) substrate which is formed with at least one hole that extends from one side of the substrate to the other side of the substrate. A p-n junction formed with an emitter and a base is joined to one side of the substrate with the hole allowing means to make electrical contact with the base. A metallic layer is extended through the hole into electrical contact with the base to establish a low resistance path between the base of the p-n junction and the back side of the substrate.

18 Claims, 3 Drawing Sheets

SOLAR CELL WITH LOW INFRA-RED ABSORPTION AND METHOD OF MANUFACTURE

BACKGROUND OF THE INVENTION

This invention was made with Government support under Contract No. F49620-84-C-0105 awarded by the Department of the Air Force. The Government has certain rights in this invention.

This invention pertains to solar cells. More particularly, the present invention pertains to solar cells that have an intrinsic gallium arsenide substrate. Further, the solar cell of the present invention may incorporate a back side reflector. This invention is particularly, but not exclusively, useful for applications which use solar radiation for the generation of electrical power.

DESCRIPTION OF THE PRIOR ART

The purpose and general construction of solar cells are well known in the pertinent art. Under accepted scientific theories, solar cells essentially comprise a p-n junction or an n-p junction and associated electrical connections. In their operation, the cells use solar energy that is above the band gap of the semiconductor to generate electron-hole pairs which produce an electrical current that can be used in various applications depending on the needs and desires of the operator.

As stated above, a solar cell uses above band gap radiation energy of relatively short wavelength to generate electron-hole pairs. Unfortunately, longer wavelength energy which is below the band gap of the solar cell, such as IR energy, is essentially useless to the operation of the cell. It should be eliminated and may be useful elsewhere. Thus, the longer wavelength energy should be reflected from the cell if the cell has an opaque substrate or allowed to pass through the cell if it has a transparent substrate. In either case, the riddance of longer wavelength energy from the cell is necessary to inhibit temperature build-up and consequent loss of cell efficiency.

One means for eliminating unused energy from a solar cell is by incorporation of a back side reflector. From the results of earlier attempts to improve solar cells, it has been determined that the overall collection efficiency of a cell having a substantially opaque substrate can be improved by incorporating a back side reflector (BSR). Basically, a BSR is a metallic layer which is functionally positioned relative to the p-n junction to reflect unused radiation from the cell. As suggested above, whatever energy is allowed to pass through the cell or is reflected out of the solar cell by the BSR can be directed to yet another solar cell having a lower band gap. This energy can then be used by the other cell for further production of electrical power. It should also be appreciated that reflection of above band gap energy may also be appropriate if the absorption coefficent of the solar cell is low, as in the case of cells having silicon substrates. With such cells, reflecting the above band gap radiation increases the collection efficiency of the cell. Also, the reflection of IR energy back to the absorber/emitter of a thermophotovoltaic device increases that device's efficiency.

Several materials have been suggested for the manufacture of solar cells. As stated above, one such material is silicon. Gallium arsenide (GaAs), however, is preferred for the present invention because of certain advantages it provides. Specifically, GaAs has a band gap of approximately 1.4 eV compared with a 1.1 eV band gap for silicon. This allows a GaAs solar cell to operate at higher temperatures with typically higher efficiencies. Also, GaAs can be more easily tuned to vary its band gap. This tuning can be done by adding either indium arsenide (InAs) to the GaAs to lower the band gap or adding aluminum arsenide (AlAs) to raise the band gap. Further, when compared with other materials, GaAs is more radiation resistant and is therefore more adaptable to an environment of high radiation, e.g. space.

The layers comprising the p-n junctions in gallium arsenide cells are typically extremely thin. This thinness is possible due to the material properties of GaAs, the method of manufacturing GaAs cells, and the fact that GaAs has a high absorption coefficient. Generally, their thickness is on the order of 2–5 microns. This thinness, while providing certain advantages, also presents a problem in that such a fragile layer is not self-supporting. Thus, in order to make practical use of a GaAs cell there must be a substrate or a superstrate to support the p-n junction. A substrate having a thickness of approximately 350 microns is typically used for epitaxial growth of the p-n junction.

A gallium arsenide substrate of this dimension, though sufficiently effective as a substrate, presents other competing considerations which directly affect the cell's operational efficiency. First, the operational efficiency of a solar cell requires that its series resistance be minimal. Second, the operational efficiency of a solar cell that operates under intense illumination should have minimal free carrier absorption, i.e. the absorption of longer wavelength radiation must be minimized in order to prevent an unwanted rise in the operating temperature of the cell. While gallium arsenide substrates can be appropriately doped to accomplish one or the other of the desired results, it cannot accomplish both desired results. Indeed, attempts to balance these factors have routinely obtained unsatisfactory results. On the one hand, a heavily doped gallium arsenide substrate presents a beneficial low series resistance. Such a substrate, however, has an unacceptable level of free carrier absorption. On the other hand, an intrinsic or nearly intrinsic (semi-insulating) gallium arsenide substrate, i.e. one that is either not doped or is lightly doped, has relatively low free carrier absorption but has a high series resistance that is unacceptable for proper operation of the solar cell.

Previous attempts to minimize the difficulties presented by free carrier absorption include the "thin cell" proposed by R. J. Boettcher, et al. in his article "Ultra Thin GaAs and AlGaAs - Solar Cells", *Proc. 16th IEEE Photovoltaic Specialist Conference*, San Diego, Calif., 1982, pp 1470–1473. In the approach taken by Boettcher, et al., a gallium arsenide p-n junction is epitaxially grown on a gallium arsenide substrate and the substrate is then etched away from the p-n junction. The result is an ultra thin cell which is bonded onto a glass superstrate that provides the necessary structural rigidity for the cell. The difficulty with Boettcher's approach is that if a BSR is incorporated with the "thin cell" it is necessary to alloy the BSR to the p-n junction in order for there to be a low resistance ohmic contact between the BSR and the base of the p-n junction. This alloying procedure, however, requires extremely high temperatures that significantly reduce the reflectivity of the metal used to fabricate the BSR. In addition, if an epoxy is used to bond the cell to the superstrate, discolorations and other changes in the epoxy at higher temperatures can limit the cell's operational utility. Further, the thinness (2-5 microns) of the ultra-thin cell leads to electrical contact difficulties at both the top and bottom of the cell.

The present invention recognizes that an intrinsic gallium arsenide substrate (GaAs), with its advantageously low free carrier absorption can be effectively used as a solar cell substrate despite its inherently high electrical resistance. Additionally, the present invention recognizes that a BSR can be effectively deposited on an intrinsic gallium arsenide substrate without subjecting the metallic substance of the BSR to the extremely high temperatures required to establish ohmic contact between the BSR and the base of the p-n junction. In accordance with the present invention, the series resistance of a solar cell having an intrinsic GaAs substrate is reduced by providing a direct metallic electrical contact that extends through the substrate to connect the base of the p-n junction with the BSR or any other suitable electrical contact.

Accordingly, it is an object of the present invention to provide a solar cell having a relatively low series resistance while also having a relatively low free carrier absorption. Still another object of the present invention is to provide a GaAs cell with a metallic back side reflector which has not been subjected to the extremely high temperatures that reduce the reflectivity of the BSR. It is another object of the present invention to provide a cost effective and a relatively easily manufactured solar cell having an intrinsic gallium arsenide substrate.

SUMMARY OF THE INVENTION

The preferred embodiment of the solar cell of the present invention comprises a flat substrate which is made of substantially intrinsic gallium arsenide formed as a layer or stratum having a first side and a second side. The cell is provided with at least one hole which extends through the substrate from the first side to the second side.

In accordance with the preferred embodiment, a p-n junction is grown onto the first side of the intrinsic gallium arsenide substrate. This p-n junction, comprising a p-type base layer and a n-type emitter, absorbs light to create electron-hole pairs. The p-n junction is oriented on the substrate with its base between the emitter and the substrate. Several other layers to improve cell operation may also be grown. For example, a contact layer to improve electrical contact with the base may be grown between the base and the substrate. Also, in order to reduce surface recombination, a window layer having a sufficiently higher band gap than the gallium arsenide emitter may be formed on the side of the emitter opposite from the base. Additionally, an antireflective coating can be deposited on the window layer to enhance the cell's ability to receive solar energy. Once the cell is grown, separate ohmic contacts are operatively placed against this structure to establish electrical connections with the emitter and those sections of contact layer or base which are exposed through the holes.

Electrical conductors are deposited into the holes that extend through the substrate to connect with the ohmic contacts which are in electrical contact with the base. These conductors may either be separate structures or the extension of a metallic layer which is deposited against the second side of the substrate to establish the BSR. As implied, this metallic layer can serve a dual function as both an electrical contact and as a back side reflector. In cells where the conductors are manufactured as separate structures from the BSR, the conductors are deposited in the holes through the substrate. A BSR may, or may not, be placed in metal-to-metal contact with the conductors to complete the electrical connection. If a BSR is not used, electrical contact can be made directly to the conductor. Under either embodiment, since these conductors provide low resistance conduits for electrical current generated at the p-n junction, the series resistance of the cell is minimized. Separate connections to both the emitter and the conductor are made to incorporate the cell into any desired electrical circuit.

As discussed above, in an alternate embodiment for the present invention, the BSR may be eliminated. If the BSR is eliminated, the substrate should be transparent to allow passage through the cell of the longer wavelength energy which is not used to create electron-hole pairs at the p-n junction. The electrical conductors extending through holes in the substrate must, however, still be incorporated. With this embodiment, electrical means can be connected with the ohmic contacts on the emitter and with the conductors to establish an electrical circuit.

The novel features of this invention, as well as the invention itself, both as to its organization and operation will be best understood from the accompanying drawings taken in conjunction with the accompanying description in which similar reference characters refer to similar parts and in which:

DESCRIPTION OF THE PREFERRED EMBODIMENT

Figure 1:
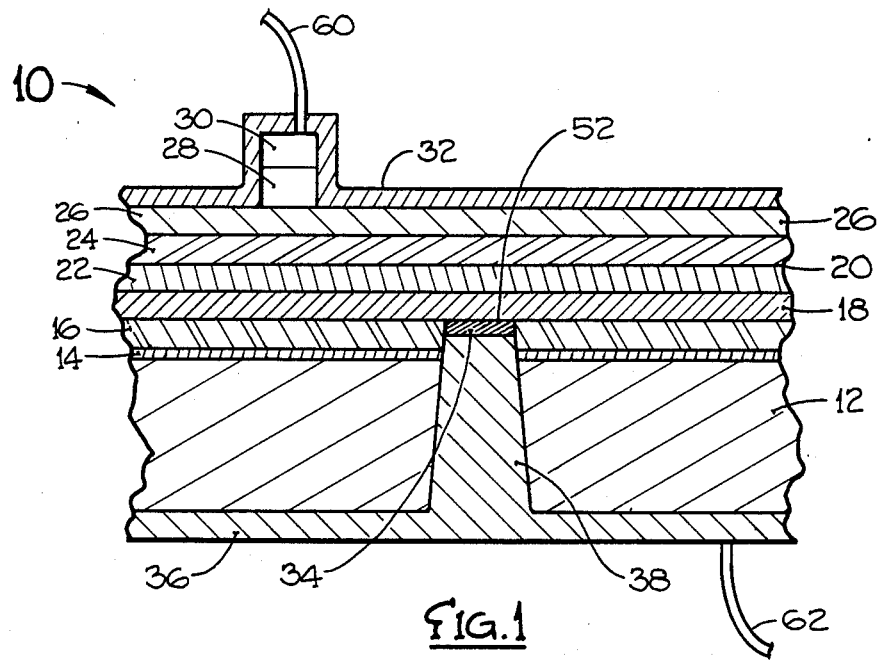
FIG. 1 is a cross-sectional view of the preferred embodiment of the solar cell of the present invention.

The structure for the preferred embodiment of the present invention is best understood by initially referring to FIG. 1. FIG. 1, which is a not-to-scale cross-sectional view of a portion of a solar cell, generally designated 10, shows that a substrate 12 which is preferably made of single crystal intrinsic gallium arsenide (GaAs) provides a supporting structure for other elements of the cell 10. As is well known, such a substrate is initially formed as a sheet having an upper first side and a lower second side. For purposes of the present invention, substrate 12 can be formed to be approximately 350 microns thick.

Layers having different properties but having similar crystalline structure can be epitaxially grown onto substrate 12 and onto other layers in a manner well known in the pertinent art. Accordingly, it will be understood that references herein to the manner of connection between layers having similar crystalline structure depend on such procedures.

With this in mind, a buffer layer 14 is grown onto substrate 12 to smooth its first side and reduce the number of surface imperfections. A "stop-etch" layer 16, preferably made of p-type $(Al_xGa_{1-x})$ As (with X approximately equal to 0.9), sometimes shorthanded as AlGaAs, is grown next to buffer layer 14 and opposite substrate 12. The composition of the AlGaAs stop-etch layer 16 is important because of its function in an etching process which is to be subsequently discussed. A contact layer 18 is then formed onto stop-etch layer 16 opposite buffer layer 14. Preferably, contact layer 18 is made of a heavily doped p-type GaAs which makes a low resistance ohmic contact with a metallic material.

The p-n junction 20 of solar cell 10 is formed on the contact layer 18 substantially as shown in FIG. 1. As shown, a p-type GaAs base 22 is grown between an n-type GaAs emitter 24 and the contact layer 18. As envisioned by the present invention, the GaAs emitter 24 and base 22 have a band gap which absorbs light that is at and above 1.4 eV. This absorption creates the electron-hole pairs which are separated at the p-n junction 20 to generate electrical current for solar cell 10. As will be understood by the skilled artisan, this band gap level can be adjusted. A window layer 26 is grown next to emitter 24 of p-n junction 20 in order to reduce surface recombination. Window layer 26 is preferably an n-type AlGaAs material having a higher band gap than GaAs. Next to a portion of window layer 26, a small cap layer 28 of heavily doped n-type GaAs is grown and then etched away to form the structure shown for the purpose of providing a means to make a low resistance electrical connnection.

This establishes the basic crystalline structure for solar cell 10. All other structure is attached to this in a manner to be subsequently disclosed. Before proceeding, however, it will be understood that p-type and n-type structures for solar cell 10 are interchangeable. In other words, all p-type structure described can be n-type and vice versa without departing from the intent and purpose of the present invention. Further, it is to be understood that n-type and p-type materials are grown in a manner well known in the relevant art.

Still referring to FIG. 1, it is seen that an ohmic contact 30 is deposited onto cap 28 and that an ohmic contact 34 is deposited against a section 52 of contact layer 18. As stated above, n-type and p-type materials may be reversed. Understanding this, but in line with the disclosure set forth above, ohmic contact 30 will be contacting an n-type cap 28. For this contact, it is preferable that contact 30 comprise a thin layer of gold germanium nickel alloy which is deposited on cap 28 to lie between the cap 28 and a much thicker layer of gold or other metal. In a similar structure, ohmic contact 34, being next to a p-type material, preferably comprises a thin layer of palladium gold alloy which is deposited onto section 52 to lie between contact layer 18 and a much thicker layer of gold or other metal. As envisioned for the present invention ohmic contact 34 may be alloyed onto contact layer 18 by heating to produce a lower resistance contact. This heat treatment step would, of course, occur prior to deposition of back side reflector 36.

FIG. 1 also shows that cap 28 and ohmic contact 30 cover a relatively small portion of window layer 26. This is so in order to allow as much light as possible to enter cell 10. FIG. 1 also shows that window layer 26, together with cap 28 and ohmic contact 30, may be covered by an anti-reflective coating 32 to improve light energy reception by solar cell 10.

A back side reflector (BSR) 36, comprising a layer of reflective metal, such as silver, is deposited on the lower second side of substrate 12 for purposes previously discussed. In the preferred embodiment, a portion 38 of BSR 36 extends through substrate 12 to make an electrical connection with ohmic contact 34. Since the contact between portion 38 and ohmic contact 34 is a metal-to-metal contact, the metal which comprises BSR 36 and portion 38 need not be directly alloyed to contact layer 18. This avoids a process involving elevated temperatures which would reduce the reflectivity of BSR 36.

With the structure as described, electrical leads 60 and 62 can be respectively connected to ohmic contact 30 and to BSR 36 to establish a path of low resistance from solar cell 10. In this manner a low resistive path is created from the p-n junction power source while maintaining the relatively low free carrier absorption realized by using intrinsic GaAs for substrate 12.

Figure 2:
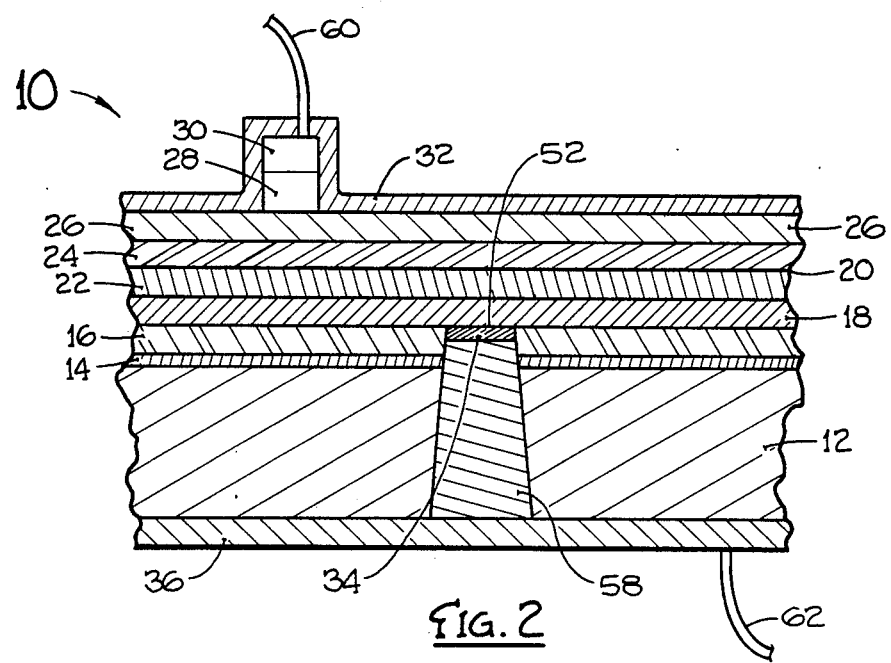
FIG. 2 is a cross-sectional view of an alternate embodiment for the solar cell of the present invention.

In an alternate embodiment for solar cell 10, as shown in FIG. 2, BSR 36 does not extend through substrate 12. Instead, an electrical conductor 58, comprised of a metal different from that used for BSR 36, such as indium, is deposited against ohmic contact 34. Conductor 58 extends from contact 34 through substrate 12 to a point where it will make metal-to-metal contact with BSR 36. In all other respects, the structure for the alternate embodiment of cell 10 is the same as that for the preferred embodiment.

Figure 4:
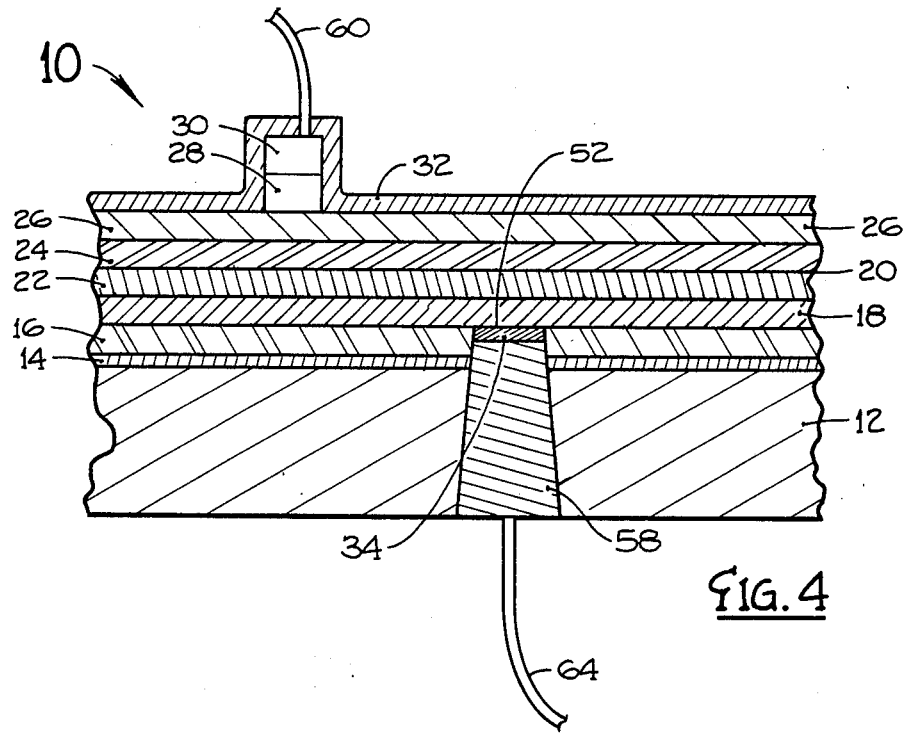
FIG. 4 is a cross-sectional view of an embodiment of the present invention in which the back side reflection has been eliminated.

In still another embodiment for solar cell 10, the BSR can be completely eliminated as shown in FIG. 4. Like the previously described alternate embodiment, the structure for the GaAs substrate 12 and its associated layers 14, 16, 18, 22, 24, and 26 remains essentially unchanged. Further, electrical conductor 58, which is shown in both FIGS. 2 and 4, is incorporated as before. In this alternate embodiment, however, the electrical connection with conductor 58 is not made through a BSR 36. Instead, an electrical lead 64 is connected directly to conductor 58 as shown in FIG. 4. Despite the specific structures herein disclosed, it will be understood that electrical connection with conductor 58 can be made in any manner well known in the pertinent art. The elimination of BSR 36 is particularly appropriate when substrate 12 is transparent to the longer wavelength energy below the band gap of solar cell 10. Without BSR 36, solar cell 10 allows this energy to transit solar cell 10 and be directed behind cell 10 in accordance with the desires of the operator.

Figure 3A:
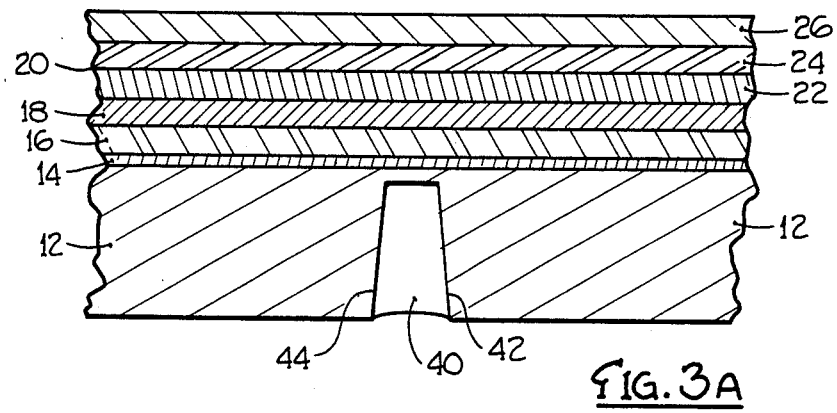
FIGS. 3A, 3B and 3C are sequential presentations of the cross-section of part of the cell at various stages during the development of the hole through the substrate.
Figure 3B:
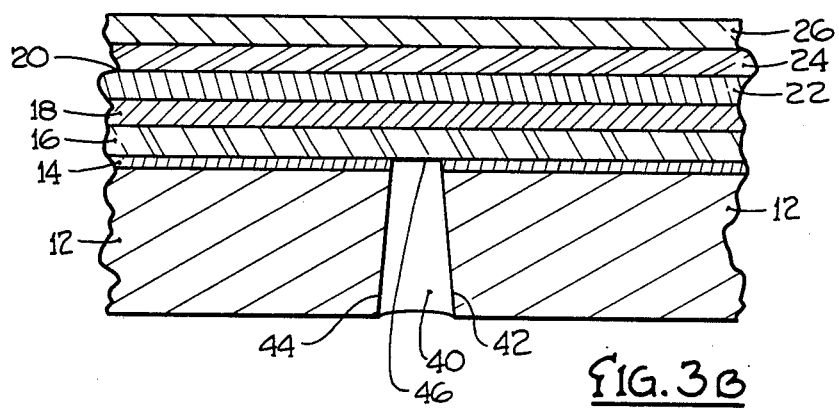
Figure 3C:
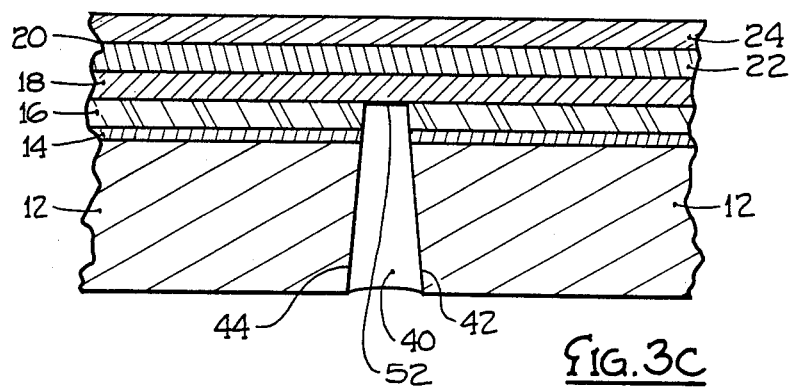

The manufacture of solar cell 10 will be best understood with further reference to FIGS. 3A, 3B and 3C. As envisioned by the present invention for solar cell 10, it is important that a hole 40 be made through substrate 12 into which an electrical conductor can be positioned. Although the discussion here pertains to a single hole 40, it is to be understood that a plurality of holes 40 may be made through the substrate 12 in accordance with subsequent disclosure. This may be accomplished mechanically or chemically in any manner known in the pertinent art. The purpose of such a conductor is to establish electrical contact between base 22 and BSR 36 or some other suitable electrical contact. It will be appreciated by the skilled artisan that hole 40 can be made through substrate 12 prior to epitaxially growing the layers discussed above onto substrate 12. For the preferred embodiment, however, hole 40 is created after the layers are grown onto substrate 12. This is accomplished substantially as follows. First, a hole 40 having sides 42 and 44, as shown in FIG. 3A, is formed into substrate 12. To do this, substrate 12 and the layers which were grown thereon are submerged into a 5% solution of nitric acid. An argon ion laser, well known in the pertinent art, is focused down onto substrate 12 causing a photochemical reaction which etches a hole in the substrate 12 until hole 40 extends substantially through substrate 12. As a practical matter, the laser etch of substrate 12 is made to within 25-75 microns of stop-etch layer 16. Substrate 12 is then removed from the nitric acid solution. Further etching of cell 10 is accomplished by using a solution of ammonium hydroxide and hydrogen peroxide to extend hole 40 down to stop-etch layer 16. Substrate 12 is now substantially as shown in FIG. 3B. It happens that this solution of ammonium hydroxide and hydrogen peroxide easily etches through the GaAs of substrate 12 and buffer 14. It is, however, stopped by the AlGaAs stop-etch layer 16. Solar cell 10 is then removed from the ammonium hydroxide/hydrogen peroxide solution and exposed to a solution of ammonium hydroxide and hydroflouric acid. This solution has a reverse effect on the elements of solar cell 10. While it etches the AlGaAs stop-etch layer 16, its etching effect is stopped by the GaAs of contact layer 18. This process results in a hole 40 substantially as shown in FIG. 3C. As discussed above, once hole 40 is created so that contact can be made through substrate 12 to contact layer 18, BSR 36 can be incorporated into solar cell 10 to result in structure substantially as shown for the preferred embodiment in FIG. 1 or for the alternate embodiment shown in FIG. 2.

While the particular solar cell as herein shown and disclosed in detail is fully capable of obtaining the objects and providing the advantages herein before stated, it is to be understood that it is merely illustrative of the presently preferred embodiment of the invention and that no limitations are intended to the details of construction or design herein shown other than as defined in the appended claims.

We claim:
1. A solar cell comprising:
   a substrate consisting of crystalline semiconductor material having a first side and a second side and having a hole extending from said first side to said second side;
   a p-n junction layer having a crystalline structure similar to said substrate epitaxially joined to said first side; and
   an electrical conductor positioned through said hole to make electrical contact with said p-n junction.
2. A solar cell as recited in claim 1 wherein said p-n junction layer comprises:
   a base region joined to said substrate to make electrical contact with said electrical conductor extending through said hole; and
   an emitter region joined with said base to position said base between said emitter and said substrate.
3. A solar cell as recited in claim 2 further comprising a window layer joined to said emitter opposite said base to reduce surface recombination.
4. A solar cell as recited in claim 3 wherein said electrical conductor is a metallic layer joined to said second side and having a portion thereof extending through said hole to make electrical contact with said p-n junction.

5. A solar cell as recited in claim 4 further comprising:
   a cap attached to said window layer for establishing ohmic contact therethrough with said emitter; and
   means attached between said base and said portion of said metallic layer extending through said hole for establishing ohmic contact between said base and said metallic layer.
6. A solar cell as recited in claim 5 wherein said metallic layer comprises a stratum joined to said second side of said substrate to create a back surface mirror.
7. A solar cell as recited in claim 6 further comprising an anti-reflection coating deposited on said window opposite said emitter.
8. A solar cell as recited in claim 7 further comprising:
   means for making electrical contact with said cap and;
   means for making electrical contact with said back side mirror.
9. A solar cell as recited in claim 8 wherein said substrate is gallium arsenide; said emitter is p-type gallium arsenide; and said base is n-type gallium arsenide.
10. A solar cell as recited in claim 9 wherein said back surface mirror is silver and said electrical conductor is Indium.
11. A solar cell as recited in claim 11 wherein said substrate is formed with a plurality of holes.
12. A solar cell as recited in claim 8 where said substrate is gallium arsenide; said emitter is n-type gallium arsenide; and said base is p-type gallium arsenide.
13. A solar cell comprising:
   an emitter;
   a base joined with said emitter to establish a p-n junction therebetween;
   means for making electrical contact with said emitter;
   a substrate consisting of crystalline semiconductor material formed with a hole, said substrate being epitaxially joined with said base to expose a section of said base through said hole; and
   an electrical conductor means extending through said hole to make electrical contact with said base.
14. A solar cell as recited in claim 13 further comprising a back side reflector joined to said substrate opposite said base and connected with said electrical conductor means for establishing electrical contact between said base and said back side reflection.
15. A solar cell as recited in claim 14 further comprising a window layer joined to said emitter opposite said base to reduce surface recombination.
16. A solar cell as recited in claim 15 further comprising an anti-reflective layer deposited on said window layer opposite said emitter to enhance the reception of solar energy by said cell.
17. A solar cell as recited in claim 16 wherein said substrate is gallium arsenide, said base is n-type gallium arsenide, said emitter is p-type gallium arsenide, said electrical conductor means is Indium, and said back side reflector is silver.
18. A method for manufacturing a solar cell having an intrinsic gallium arsenide substrate comprising the steps of:
   (a) Growing a buffer layer on said first side;
   (b) Growing a stop-etch layer on said buffer layer opposite said substrate;
   (c) Growing a contact layer on said stop-etch layer opposite said buffer layer;

(d) Growing a base on said contact layer opposite said stop-etch layer;
(e) Growing an emitter layer on said base opposite said contact layer;
(f) Growing a window layer on said emitter opposite said base;
(g) Drilling a hole partially through said substrate from said second side toward said first side;
(h) Etching said cell until said hole is enlarged to expose a section of said contact layer;
(i) Depositing a metallic layer on said second side to form a back side reflector with said metal layer in electrical contact with said contact layer; and
(j) Connecting electrical leads with said window layer and with said back side reflector.

* * * * *